United States Patent [19]
Dobson

[11] Patent Number: 5,843,535
[45] Date of Patent: Dec. 1, 1998

[54] FORMING A LAYER

[75] Inventor: Christopher David Dobson, Bristol, United Kingdom

[73] Assignee: Trikon Technologies Limited, Newport, United Kingdom

[21] Appl. No.: 530,195

[22] PCT Filed: Feb. 2, 1995

[86] PCT No.: PCT/GB95/00259

§ 371 Date: Oct. 2, 1995

§ 102(e) Date: Oct. 2, 1995

[87] PCT Pub. No.: WO95/22170

PCT Pub. Date: Aug. 17, 1995

[30] Foreign Application Priority Data

Feb. 9, 1994 [GB] United Kingdom .................. 9402486

[51] Int. Cl.⁶ .............................. B05D 3/02; B06B 1/00; B05C 3/00
[52] U.S. Cl. .................................. 427/430.1; 427/372.2; 427/600; 118/429
[58] Field of Search ............................ 427/430.1, 372.2, 427/600; 118/429

[56] References Cited

U.S. PATENT DOCUMENTS 5,279,316  1/1994  Miranda ................................ 134/102.1
5,308,792  5/1994  Okabayashi et al. .................... 437/180

FOREIGN PATENT DOCUMENTS 0 516 344  12/1992  European Pat. Off. .
2 196 566   5/1988  United Kingdom .

*Primary Examiner*—Shrive Beck
*Assistant Examiner*—Bret Chen
*Attorney, Agent, or Firm*—Jones & Volentine, L.L.P.

[57] ABSTRACT

The invention relates to apparatus for use in a process in which a layer is formed on a surface of a workpiece and then forced into underlying voids. The apparatus for applying elevated pressure to the workpiece 1 comprises a chamber 103 (which includes a workpiece support 109a) means 108 for flooding the chamber 103 with liquid to immerse a workpiece 1 on the support 109a and means for applying a pulse of elevated pressure to the liquid and hence the workpiece. These means may include a liquid reservoir 102, which shares a common flexible wall 101 with the chamber 103, and electrodes 100 and 104 to which a high voltage pulse can be supplied to create a shock in the liquid of reservoir 102 which is transmitted to the liquid in 103 via the wall 101.

21 Claims, 3 Drawing Sheets

FORMING A LAYER

The present invention relates to arrangements in which a layer of material is formed on a surface, and then that material is introduced into holes or trenches in the surface. It is particularly, but not exclusively, concerned with arrangements in which that surface is a surface of a semiconductor wafer (or substrate use for integrated circuits).

There are a number of situations during the formation of a semiconductor device in a semiconductor wafer where it is necessary to deposit a layer onto the wafer. One such situation arises when conductive or semiconductive tracks are to be formed over the wafer, so that those tracks may make contact with active regions of the device or circuit. Normally, such tracks must then extend through an insulating layer on the surface of the wafer so as to make contact with active regions below that insulating layer, or with further conductive tracks below that insulating layer (when the holes are usually called "vias"). Where the track extends through a hole in this way, it is important that the amount of material e.g. metal filling that hole is sufficient to ensure good electrical contact.

Another situation is when an electrically insulating layer is to be formed over the wafer, in order to isolate active regions and/or conductive tracks from each other, or to form a protective covering known as a passivation layer. Such a layer is often required to cover conductive tracks or other structures on the wafer, and these structures may be close to each other so that the gaps between them form narrow trenches. It is important that the insulating material covers all the surface with sufficient thickness to provide good electrical insulation, and that the top surface of the insulating layer is sufficiently smooth for the next stage of wafer processing.

In our European Patent Application No. EP-A-0516344 we proposed that a layer was formed on the surface of an article, in which surface there was a recess such as a hole or trench. Then, it was proposed that the article, including the layer, was subjected to elevated pressure and elevated temperature sufficient to cause the layer to deform. By suitable control of the temperature and pressure, the layer deformed sufficiently to cause the material of the layer to enter the recess to fill it.

It was thought that the primary factor causing the deformation was plastic flow by dislocation slips, activated by the elevated pressure and temperature. Surface diffusion, grain boundary diffusion and lattice diffusion were also thought to have an effect, activated by the elevated temperature. In our International Application No. PCT/GB93/02359 we discussed the possibility of the same effect being achieved by elevated pressures, without the need for elevation of temperature. We also disclosed in that specification the possibility of achieving the elevated pressure by use of a liquid in contact with the wafer.

The present invention develops that latter idea, by proposing that the elevated pressure is achieved by a pressure pulse within the liquid, rather than a static pressure change. It has been found that it is relatively straightforward to create pressure pulses in liquids which are sufficient to cause the article to be subject to pressures which are sufficient to deform the layer.

Thus from one aspect the invention includes apparatus for applying elevated pressure to the surface of a workpiece comprising a chamber, means for supporting a workpiece within the chamber, means for flooding the chamber with liquid to immerse the workpiece support and means for applying a pulse of elevated pressure to the liquid, and hence the workpiece support, when the chamber is flooded.

Preferably, as in EP-A-0516344, elevated temperatures are used. Since the present invention makes use of a pressure pulse, it also preferably makes use of a heating pulse which is transmitted from suitable heating means to the wafer by thermal transport through the liquid. This has the advantage of reducing the overall heating of the liquid and thus less heating power is needed than would otherwise be necessary if the article was to be maintained at an elevated temperature for a relatively long period of time. The use of elevated temperatures is preferable, since it reduces the pressure of the pressure pulse that is needed.

It is desirable to use a liquid which does not contaminate the article, or leave residues behind on the article after processing. Preferably, the liquid is one with no dissolved solids. For semiconductor wafers, it is currently thought that water will provide a suitable liquid, because ultra-pure water is normally available for other reasons where semiconductor wafers are processed. However, ethanol may also be used as discussed in PCT/GB93/02359.

There are many ways of generating the pressure pulse in the liquid which is required in the present invention. A mechanical shock can be generated by causing an object to impact on the liquid, or an explosive shock may be generated. However, it is currently thought preferable for the shock to be generated electrically. For example, if energy is stored in a suitable capacitor, and that energy is then fed to a pair of electrodes in contact with the liquid, this will generate an electro-explosive shock. A further possibility is to apply a short, high current, pulse to a coil, which then generates inductive repulsion of an adjacent plate of suitable non-magnetic material, such as copper. That inductive repulsion pulse then repels the plate which induces a pulse in the fluid, which is in contact with the plate, thereby applying a pressure pulse.

As was discussed in EP-A-0516344 and PCT/GB93/02359 the precise conditions of the pressure pulse necessary to achieve the deformation of the layer will depend on the materials used, but for aluminium or aluminium alloys, the pressure will have to be higher than $200 \times 10^6$ Pa (30,000 p.s.i.) and pressures in excess of $700 \times 10^6$ Pa (100,000 p.s.i.) have been found to be suitable. The duration of the pulse is typically less than $10^{-3}$ s.

Alloys commonly used for forming conductive tracks are of composition Al/0–2% Si/0–4% Cu/0–2% Ti, and these have been found to deform suitably under such conditions.

The present invention is not limited to one particular method of forming the layer, and sputtering or chemical vapour deposition techniques may be used as discussed above, although other alternatives such as vacuum evaporation or application of a liquid may also be used. Indeed, it is possible for the layer to be pre-formed, as a film, which film is then positioned on the article.

Thus, to form a layer on a semiconductor wafer, which layer is to extend through holes or into trenches in an underlying layer on the surface of the wafer, material for forming the layer (e.g. aluminium or other suitable material) is first deposited on the surface of the underlying layer by e.g. sputtering. The material may then be deposited on the sides and base of the hole or trench, although the thickness at the mouth of the structure will be greater. When a suitable amount of material has been deposited deposition stops and the result is subject to a pressure pulse and, if desired, a heating pulse to cause movement of the material to fill the structure, or to move into the structure sufficiently to allow a reliable electrical contact if the material is a metal, or to provide a reliable electrical insulation if the material is an isolator.

It is important that the mouth of the structure is completely closed by the deposition, leaving a void below the closed mouth within the structure. Such closing of the mouth of the structure enables the material to be pushed down into the structure, collapsing the void by the elevated pressure outside it. The void will therefore be filled when the material moves under the elevated conditions. Thus, unlike the prior art arrangements, the closing of the mouth of the structure does not represent a limit to the amount of the material that may, at the end of the procedure, fill the structure to achieve a satisfactory contact or insulator.

Aluminium, or some aluminium alloys, are particularly suitable for use with the present invention because their yield strengths are lower than other metals commonly used. Thus, they will deform to move into or fill the hole at relatively lower pressures. For other materials, the pressures will need to be higher.

Embodiments of the present invention will now be described in detail, by way of example, with reference to the accompanying drawings, in which.

Figure 1:
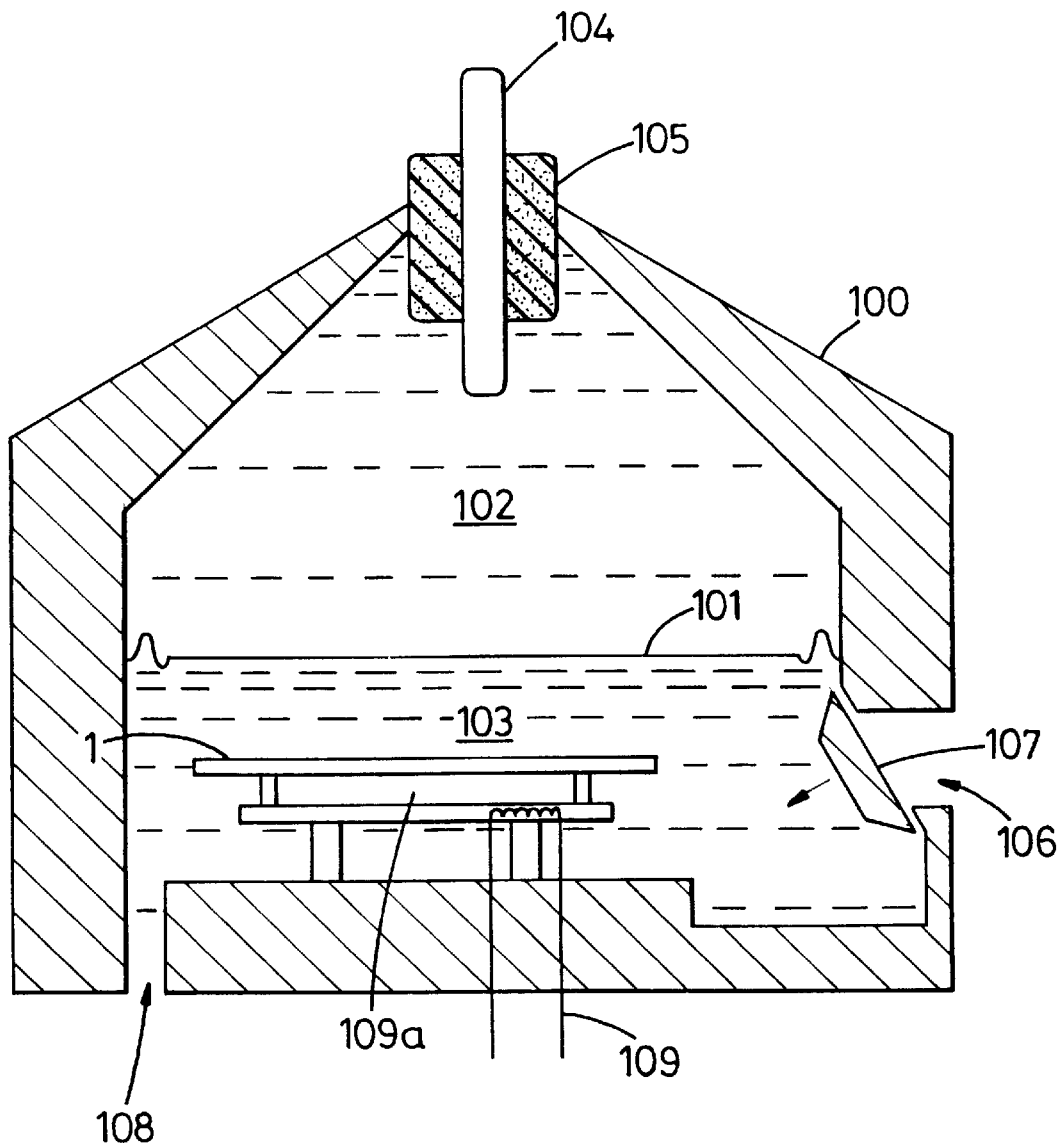
FIG. 1 shows an apparatus for subjecting a layer to a pressure pulse, being a first embodiment of the present invention.

Referring first to FIG. 1, an apparatus for subjecting an article, such as a semiconductor wafer, to a pressure pulse has an outer casing 100 which is hollow and has a membrane 101 extending within it to divide the interior of the casing 100 into an upper chamber 102 and a lower chamber 103. An electrode 104 extends into the upper chamber 102, and there is insulation material 105 between the electrode 104 and the casing 100. The casing 100 itself is conductive. The upper chamber 102 is filled with a liquid such as water.

The casing 100 has a first opening 106 therein, and there is a door 107 associated with the opening 106. The door 107 is movable to permit a wafer 1 to be introduced into the lower chamber 103. The door 107 is then moved to close the opening 106 and liquid, normally of the same type as in the chamber 102, is introduced into the lower chamber 103 via another opening 108. The lower chamber 103 also contains a heater 109.

FIG. 1 shows the support 109 for the wafer 1, but not the transport mechanism. Such a mechanism will be provided in order to permit the wafer 1 to be introduced into the chamber 103.

In order to create a pressure pulse, a high voltage of short duration is applied between the electrode 104 and the casing 100. Such a high voltage short pulse may be generated by discharging a capacitor. The pressure pulse is short, normally less than $10^{-3}$ s. The amount of energy that would be required to provide a suitable pressure pulse is then of the order of $10^9$ Pa.

The pressure pulse is then transmitted through the liquid in the upper chamber 102 to the membrane 101, and from then to the liquid in the lower chamber 103. The membrane 101 has the effect of preventing contamination between the chambers 102 and 103, and also reduces the amount of liquid needed for the processing of each wafer.

It is preferable that the wafer 1 is subjected to elevated temperatures when the pressure pulse is applied thereto. The elevated temperatures reduce the pressure of the pressure pulse that is needed in order to cause a layer of material on a surface of the water to move into holes or trenches in the surface of the wafer. Since a pressure pulse is used, it is also preferable to apply a heating pulse which enables the wafer 1 to be heated without needing large amounts of energy that would heat the liquid in the chambers 102, 103. To achieve this, the heater may be formed by a coil which receives a high current for short duration, the heat then being transmitted through the liquid in the chamber 103 to the wafer 1. Preferably, the wafer should reach temperatures above 300° C., but there is a relationship between pressure and temperature with higher pressures being needed at lower temperatures.

The effect of the pressure pulse on the wafer 1 will now be described, with reference to FIGS. 2 to 5. It can be noted that this effect is similar to that achieved in EP-A-0516344 and PCT/GB93/02359, except that the present invention makes use of a pressure pulse.

Figure 2:
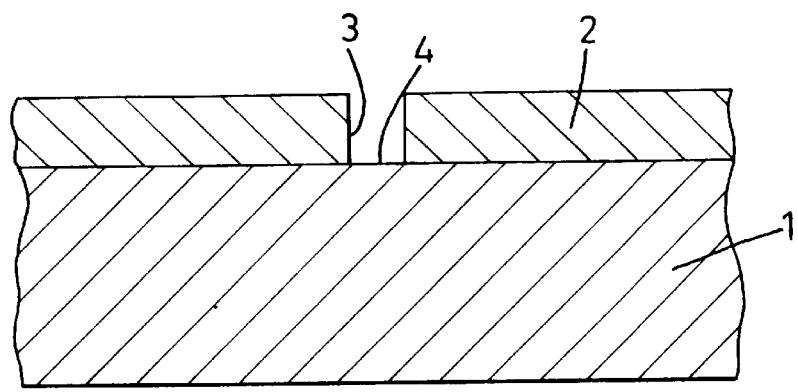
FIG. 2 shows a cross-section of a semiconductor wafer prior to the formation according to the present invention.

FIG. 2 shows the semiconductor wafer 1 with a preexisting layer 2 thereon. The wafer 1 itself may contain a plurality of layers and/or regions of different properties, to form a semiconductor device, and will be the result of a fabrication process involving a plurality of stages for forming those layers and/or regions. The internal structure of the wafer 1 is not of significance in the present invention, and therefore these layers and/or regions will not be discussed further.

The layer 2 has a hole or trench structure 3 therein, and this embodiment of the present invention is particularly concerned with the problem of forming a layer over the pre-existing layer 2, e.g. so that either an electrical contact can be made by a metal layer to the surface 4 of the wafer 1 within the hole or trench structure 3, or a layer can be formed that can be made semiconductive in known manner. That surface 4 may thus be in contact with e.g. active regions within the wafer, or further conductive tracks within the structure on the wafer.

Figure 3:
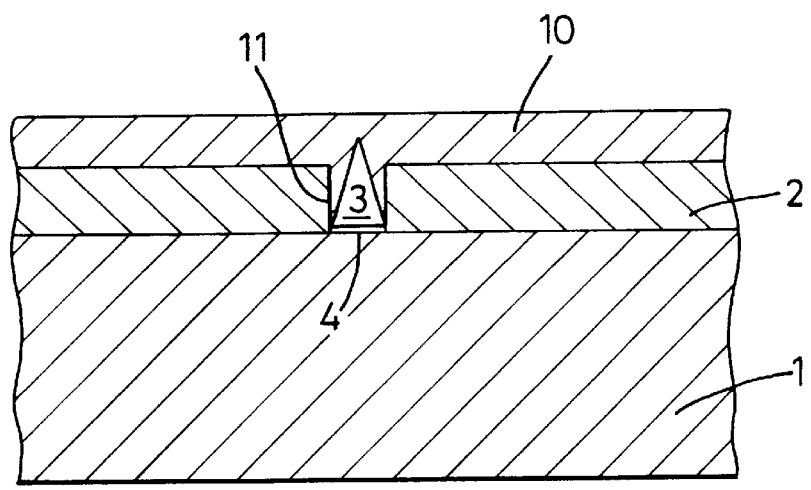
FIG. 3 shows a cross-section of the wafer of FIG. 2, at an intermediate stage in the formation of a layer according to the present invention.

To form a metal layer, a material such as aluminium is sputtered onto the surface of the layer 2 e.g. in a downward or sideways direction in FIG. 1. Sputtering can also be done upwards if desired. To form an insulating layer, a material such as silicon dioxide is deposited onto the surface of the layer 2 by e.g. chemical vapour deposition. This process continues until the new layer over the pre-existing layer 2 has a suitable thickness. This is shown in FIG. 3, with the new layer shown at 10. With such deposition techniques, deposition of the material to form the layer 10 tends to occur more rapidly at the mouth of the structure 3, as compared with its side walls and its base, formed by surface 4. As a result, as shown in FIG. 3, the side walls 11 of the hole or trench structure 3, and the surface 4, have a relatively thin layer of material thereon, as compared with the layer 10 covering the surface of the pre-existing layer 2. It can thus be seen that satisfactorily reliable electrical connection or insulation to the wafer 1 at the surface 4 may not be achieved. Furthermore, it is not normally possible to increase the amount of deposition on the side walls 11 and the surface 4 by continuing the deposition process, because that deposition process will eventually close the gap in the layer 10 above the hole or trench structure 3, preventing further deposition within that structure 3 and leaving a void.

It is important that deposition should close the mouth of the structure. In some case, this may require more thickness than required elsewhere to be deposited, in which case excess material can be removed by etching, after the structure has been filled. This idea of wholly sealing the void may also be achieved by providing a capping layer over the layer which thus may seal any open voids. Such a capping layer may also improve the configuration of the final surface. Such a capping layer may be any suitable material, and may have a higher Youngs modulus than the layer being capped at the temperature/pressure at which it is to deform. After the wafer ha s been subject to the elevated pressure conditions, the capping layer may be removed or may be left in place depending on the material of that capping layer.

Figure 4:
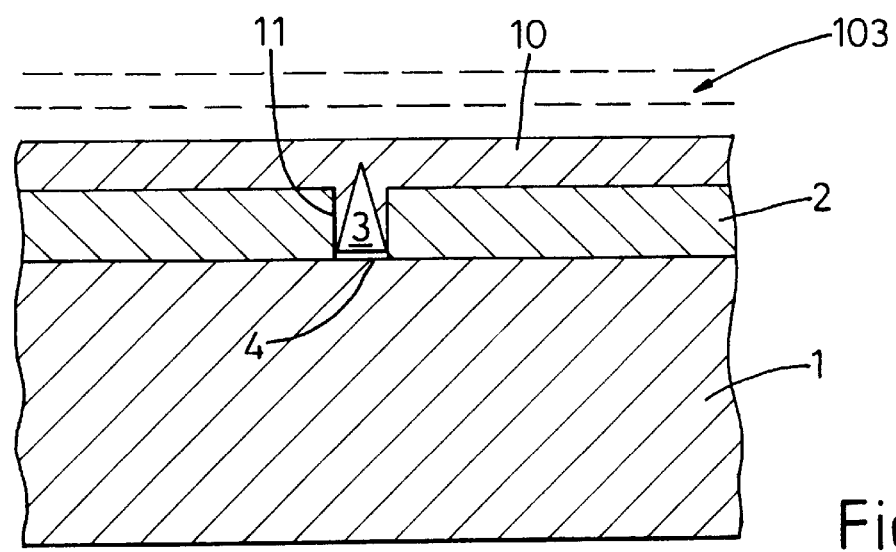
FIG. 4 shows a cross-section of the wafer of FIG. 3 when mounted in the apparatus of FIG. 1.
Figure 5:
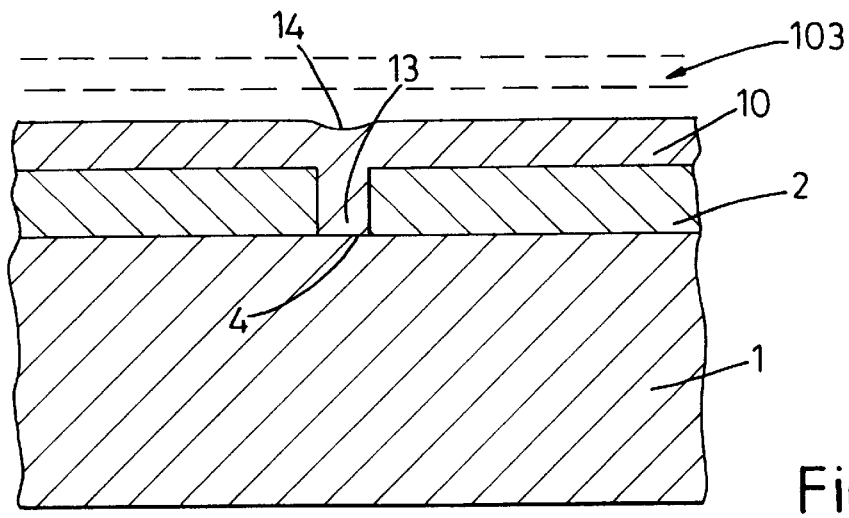
FIG. 5 shows a cross-sectional view of the wafer of FIG. 4, after the pressure pulse.

Therefore, once the stage of FIG. 3 has been reached, further deposition of the material ceases, and the wafer shown in FIG. 3 is then transferred into the apparatus shown in FIG. 1, to create the arrangement shown in FIG. 4, and the wafer 1 subjected to heating and to a pressure pulse. Such elevated temperature and the pressure pulse causes the material of layer 10 to flow proximate the structure 3, and this process may continue until the structure 3 is filled, as shown in FIG. 5. Material 13 then entirely fills the structure 3 and thus a satisfactory electrical contact to the surface 4 may then be achieved. There may be a small depression 14 in the layer 10 above the structure 3, due to the flow of material 13 into the structure 3 to fill it, but this depression does not affect the electrical properties of the device.

In this way, a satisfactory contact can be achieved, and it is found that this method is not affected by the width of the structure 3.

As has previously been mentioned, it is important for the layer 10 wholly to cover the hole or trench structure 3, so that the void is sealed. This closing of the mouth of the structure 3 enables the material to be pushed down into the structure 3, because of the pressure differential across the layer 10 at the site of the structure 3. Therefore, there is little advantage to be gained by depositing material within the structure 3, as shown in FIG. 3. Although the arrangement described with respect to FIG. 3 assumes that a relatively thin layer of material is deposited on the side walls 11 of the structure 3, and the surface 4, such deposition retards closing of the mouth of the structure 3, thereby increasing the thickness of the layer 10 which needs to be deposited in order to close that mouth.

In the embodiment discussed above, a pressure pulse is created by applying a high voltage of short duration between the electrode 104 and the casing 100. Other methods are also known for generating pulses in a liquid. For example, a mechanical shock can be applied to the liquid by the impact of a rigid body thereon, or by the application of an explosive shock thereto.

Figure 6:
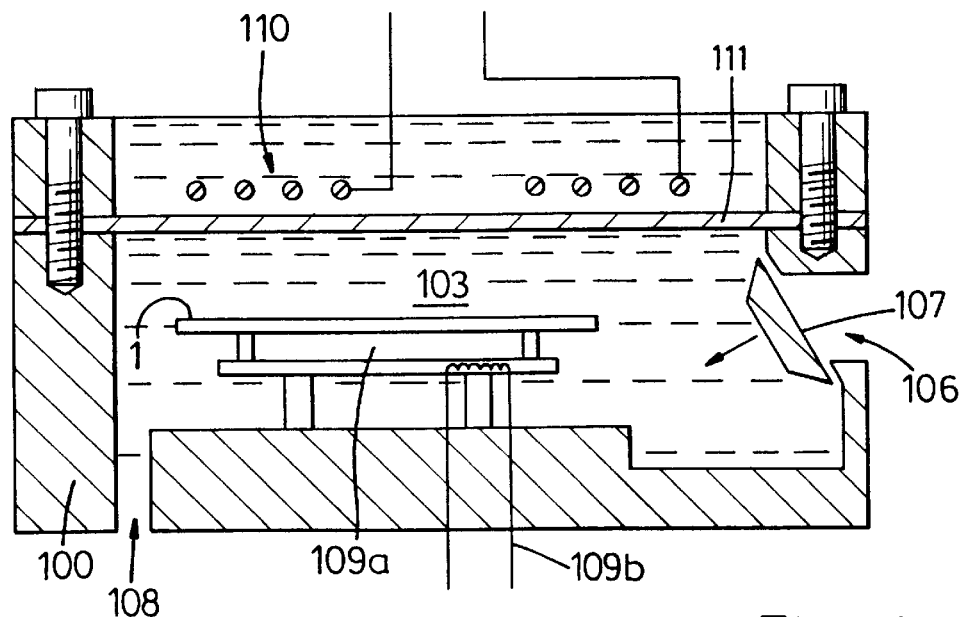
FIG. 6 is a cross-sectional view of a second embodiment of apparatus according to the present invention.
Figure 7:
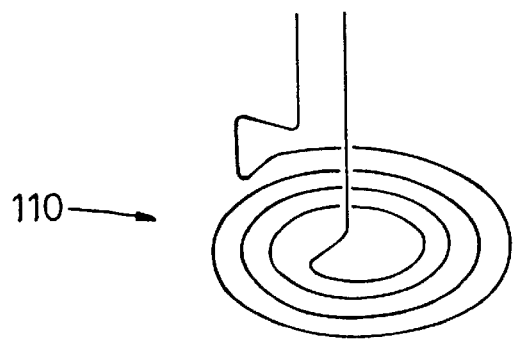
FIG. 7 is a schematic view of the flat spiral electrode of the embodiment of FIG. 6.

Referring to the embodiment of FIGS. 6 and 7, it is also possible to apply an electromagnetic pulse to the liquid, to create a pressure pulse. For example, a flat spiral coil 110 may be provided proximate a thin plate 111 of e.g. copper, which plate is clamped at its periphery to the casing 100 and is in contact with the liquid in the chamber 103. A high current pulse is then applied to the coil 110, which induces currents in the copper plate 111, causing inductive repulsion of the plate 111. That repulsion is in pulsed form, and is transmitted to the liquid in the chamber 103. The other components in the second embodiment are similar to those of the first and given similar reference numbers. Other known methods of applying pressure pulses may also be used.

In the embodiment shown in FIG. 1, the wafer 1 is generally parallel to the membrane 101, so that it will receive a pressure pulse propagating in a direction generally perpendicular to the wafer 1. This is not essential, and arrangements are possible within the present invention in which the wafer is mounted in a chamber and a pressure pulse is created at one end of that chamber so that the pressure pulse propagates in a direction generally parallel to the wafer. The pressure pulse will then act on different parts of the wafer at different times, as it propagates along the length of the wafer. In order to achieve substantially uniform pressures along the length of the wafer, it may be necessary to reduce the transverse width of the chamber in the direction of propagation of the pressure pulse, to counteract the effects of energy dissipation as the pressure pulse moves. Other chamber arrangements are also possible within the scope of the present invention.

Although the invention has been described in relation to a batch processing arrangement, in which the wafer 1 is moved into the apparatus shown in FIG. 1 and subjected to a pressure pulse, and then removed before a second wafer 1 is processed. It may also be possible to provide continuous arrangements by moving wafers into and out of a bath of the liquid and subjecting them to pressure pulses once they are in the bath.

I claim:

1. An apparatus for applying pressure to a coated surface of a workpiece, comprising:

a chamber having a door which opens to introduce the workpiece into said chamber and which closes to enclose the workpiece within said chamber;

a workpiece support, located within said chamber, which supports the workpiece such that the coated surface of the workpiece faces in a given direction;

a liquid supply means for flooding said chamber with a liquid to immerse said workpiece support; and a pressure pulse supply means for applying a pulse of pressure to the liquid such that the pulse of pressure is transmitted through the liquid in a direction opposite the given direction, wherein the pulse of pressure is incident via the liquid on the coated surface of the workpiece supported by said workpiece support;

wherein said pressure pulse supply means includes means for generating a pressure shock which is directed onto the liquid supplied by said liquid supply means;

wherein said means for generating a pressure shock includes a pair of electrodes for contacting the liquid supplied by the liquid supply means and means for applying a voltage across the electrodes.

2. An apparatus as claimed in claim 1, wherein a pressure of the pulse exceeds $200 \times 10^6$ Pa.

3. An apparatus as claimed in claim 2, wherein a duration of the pulse is less than $10^{-3}$ seconds.

4. An apparatus as claimed in claim 1, wherein a pressure of the pulse exceeds $700 \times 10^6$ Pa.

5. An apparatus as claimed in claim 4, wherein a duration of the pulse is less than $10^{-3}$ seconds.

6. An apparatus as claimed in claim 1, wherein one of the electrodes is constituted by a part of the chamber or a liquid reservoir which is in contact with the liquid and the other electrode lies in the liquid.

7. An apparatus as claimed in claim 1, wherein said means for applying a voltage includes a capacitor.

8. An apparatus as claimed in claim 1, further comprising means for generating a heat pulse to the workpiece support in synchronism with the pulse of pressure.

9. An apparatus as claimed in claim 1, wherein the workpiece is a semiconductor wafer.

10. An apparatus for applying pressure to a coated surface of a workpiece, comprising:

a chamber having a door which opens to introduce the workpiece into said chamber and which closes to enclose the workpiece within said chamber;

a workpiece support, located within said chamber, which supports the workpiece such that the coated surface of the workpiece faces in a given direction;

a liquid supply means for flooding said chamber with a liquid to immerse said workpiece support;

a pressure pulse supply means for applying a pulse of pressure to the liquid such that the pulse of pressure is transmitted through the liquid in a direction opposite the given direction, wherein the pulse of pressure is incident via the liquid on the coated surface of the workpiece supported by said workpiece support;

a wall within said chamber, wherein said wall is at least one of flexible and movable such that the pulse of pressure is transmitted therethrough;

a liquid-filled reservoir within said chamber for receiving the liquid from said liquid supply means, wherein said workpiece support and said wall are contained within said liquid-filled reservoir, and said wall extends above said workpiece support in a plane which is perpendicular to the given direction, and wherein said pressure pulse supply means is for applying a downward force on said wall to cause the wall to transmit the pulse of pressure to the workpiece support via the liquid;

wherein said pressure pulse supply means includes means for generating a pressure shock which is directed onto the liquid supplied by said liquid supply means;

wherein said means for generating a pressure shock includes a pair of electrodes for contacting the liquid supplied by the liquid supply means and means for applying a voltage across the electrodes.

11. An apparatus as claimed in claim 10, wherein one of the electrodes is constituted by a part of the chamber or the liquid reservoir which is in contact with the liquid and the other electrode lies in the liquid.

12. An apparatus as claimed in claim 10, wherein said means for applying a voltage includes a capacitor.

13. An apparatus for applying pressure to a coated surface of a workpiece, comprising:

a chamber having a door which opens to introduce the workpiece into said chamber and which closes to enclose the workpiece within said chamber;

a workpiece support, located within said chamber, which supports the workpiece such that the coated surface of the workpiece faces in a given direction;

a liquid supply means for flooding said chamber with a liquid to immerse said workpiece support; and a pressure pulse supply means for applying a pulse of pressure to the liquid such that the pulse of pressure is transmitted through the liquid in a direction opposite the given direction, wherein the pulse of pressure is incident via the liquid on the coated surface of the workpiece supported by said workpiece support;

wherein said pressure pulse supply means includes means for generating a pressure shock which is directed onto the liquid supplied by said liquid supply means;

wherein the means for generating a pressure shock includes an electromagnetic coil, an electrically conductive non-magnetic object having a working face in contact with the liquid supplied by said liquid supply means and means for applying a pulse of current to the coil to cause said object to apply the pulse of pressure to the liquid.

14. An apparatus as claimed in claim 13, wherein said object has a generally planar working face and is disposed between said coil and the liquid, and wherein said pulse of current causes said working face to repel against the liquid.

15. An apparatus for applying pressure to a coated surface of a workpiece, comprising:

a chamber having a door which opens to introduce the workpiece into said chamber and which closes to enclose the workpiece within said chamber;

a workpiece support, located within said chamber, which supports the workpiece such that the coated surface of the workpiece faces in a given direction;

a liquid supply means for flooding said chamber with a liquid to immerse said workpiece support; and a pressure pulse supply means for applying a pulse of pressure to the liquid such that the pulse of pressure is transmitted through the liquid in a direction opposite the given direction, wherein the pulse of pressure is incident via the liquid on the coated surface of the workpiece supported by said workpiece support;

a wall within said chamber, wherein said wall is at least one of flexible and movable such that the pulse of pressure is transmitted therethrough;

a liquid-filled reservoir within said chamber for receiving the liquid from said liquid supply means, wherein said workpiece support and said wall are contained within said liquid-filled reservoir, and said wall extends above said workpiece support in a plane which is perpendicular to the given direction, and wherein said pressure pulse supply means is for applying a downward force on said wall to cause the wall to transmit the pulse of pressure to the workpiece support via the liquid;

wherein said pressure pulse supply means includes means for generating a pressure shock which is directed onto the liquid supplied by said liquid supply means;

wherein the means for generating a pressure shock includes an electromagnetic coil, an electrically conductive non-magnetic object having a working face in contact with the liquid supplied by said liquid supply means and means for applying a pulse of current to the coil to cause said object to apply the pulse of pressure to the liquid;

wherein said object has a generally planar working face and is disposed between said coil and the liquid, and wherein said pulse of high current causes said working face to repel against the liquid.

16. A method of treating a workpiece having a coating covering a surface thereof, the coating extending over a trench or hole of the workpiece to form a void in the trench or hole of the workpiece, said method comprising immersing the workpiece in a liquid such that the surface having the coating faces in a given direction, and applying a pressure pulse to the liquid in a direction opposite to the given direction, wherein the pressure pulse travels through the liquid and is incident via the liquid on the surface having the coating so as to force a local portion of the coating on the surface of the workplace into the void located beneath the portion to fill the trench or hole of the workpiece.

17. A method as claimed in claim 16, further comprising applying a heating pulse for heating the workpiece prior to or during application of the pressure pulse.

18. A method as claimed in claim 16, wherein a pressure of the pressure pulse exceeds $200 \times 10^6$ Pa.

19. A method as claimed in claim 18, further comprising applying a heating pulse for heating the workpiece prior to or during application of the pressure pulse.

20. A method as claimed in claim 16, wherein a pressure of the pressure pulse exceeds $700 \times 10^6$ Pa.

21. A method as claimed in claim 16, wherein a duration of the pressure pulse is less than $10^{-3}$ seconds.

* * * * *